United States Patent [19]
Hooley

[11] Patent Number: 5,640,303
[45] Date of Patent: Jun. 17, 1997

[54] INTERCONNECTION APPARATUS FOR SEMICONDUCTOR/INTEGRATED CIRCUIT DEVICES

[75] Inventor: Robert W. Hooley, Scottsdale, Ariz.

[73] Assignee: Precision Connector Designs, Inc., Peabody, Mass.

[21] Appl. No.: 549,913

[22] Filed: Oct. 30, 1995

[51] Int. Cl.⁶ ............................................. H05K 7/20
[52] U.S. Cl. ...................... 361/699; 165/46; 165/80.3; 257/714; 257/719; 361/704; 361/785; 439/197; 439/331
[58] Field of Search ............... 165/46, 80.3, 80.4, 165/185; 257/718, 714, 719; 361/689, 698–699, 785; 439/67, 71–73, 77, 197, 260, 331

[56] References Cited

U.S. PATENT DOCUMENTS

| | | |
|---|---|---|
| 4,583,287 | 4/1986 | McDevitt et al. . |
| 4,886,461 | 12/1989 | Smith ........................................ 439/67 |
| 4,961,633 | 10/1990 | Ibrahim et al. . |
| 4,962,356 | 10/1990 | Eberlein et al. . |
| 5,360,348 | 11/1994 | Johnson . |
| 5,433,632 | 7/1995 | Cherney et al. . |

*Primary Examiner*—Gregory D. Thompson
*Attorney, Agent, or Firm*—Jerry Cohen; Jacob N. Erlich

[57] ABSTRACT

An interconnection assembly for electrically connecting the contacts of an integrated circuit device with the contacts of said circuit board. The interconnection assembly having a base removably and adjustably attached to the circuit board and further having a preselected configuration for accepting the integrated circuit device therein such that the contacts thereon are aligned with the contacts on the circuit board. A bladder-like member having fluid therein is interposed between the integrated circuit and a closure element for forcing the bladder-like member into contact with the integrated circuit device thereby causing the contacts thereon to make electrical connections with the contacts on the circuit board. The base can accept various sized integrated circuit devices therein and the base having an edge thereon for supporting the periphery of the bladder-like member in such a position to enable the majority of the undersurface of the bladder-like member to bear against the integrated circuit device during electrical connection with the circuit board.

18 Claims, 3 Drawing Sheets

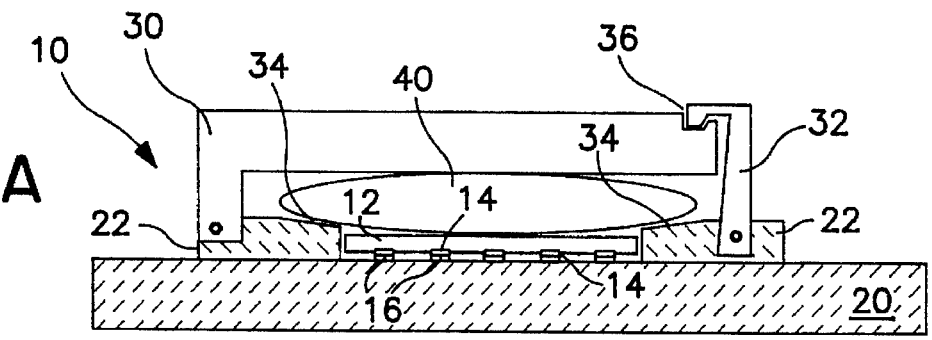
FIG. IA
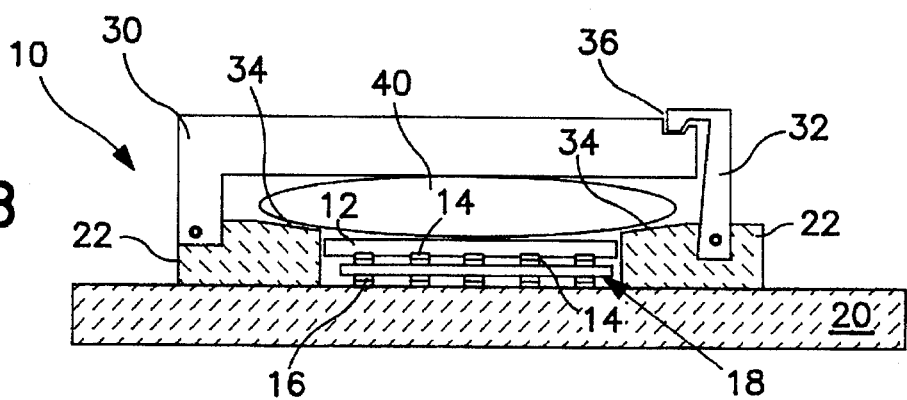
FIG. IB
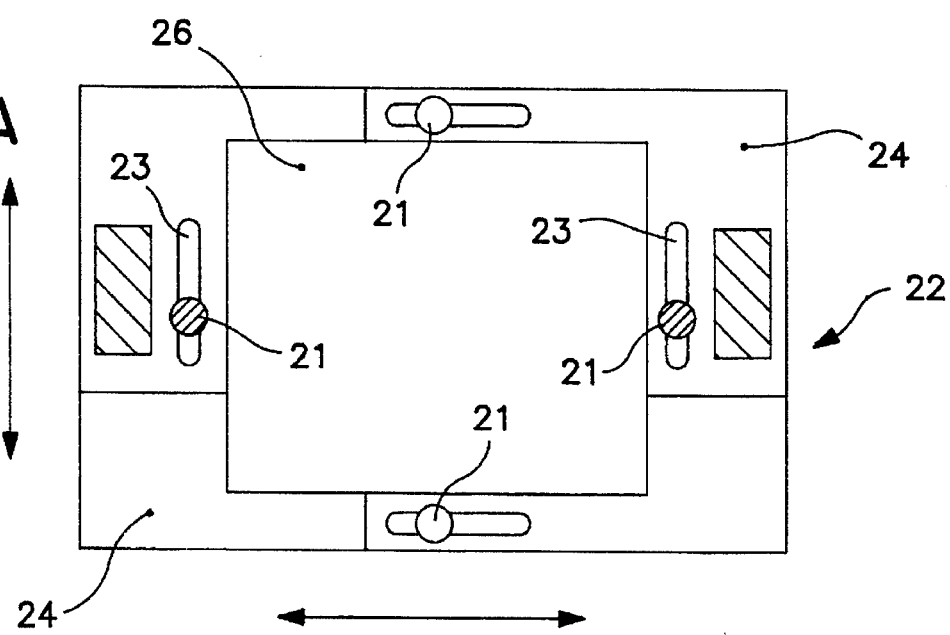
FIG. 2A

INTERCONNECTION APPARATUS FOR SEMICONDUCTOR/INTEGRATED CIRCUIT DEVICES

FIELD OF THE INVENTION

The present invention relates to an apparatus for providing a uniform force distribution across the top of a semiconductor die, chip or other such package, or integrated circuit device, all hereinafter defined as an "integrated circuit" or "integrated circuit device" (IC). This uniform pressure or force physically pushes the bonding pads, leads, contacts or other such electrical connections of the integrated circuit into electrical contact with the contacts of a socket, and, more particularly a test and burn-in socket.

BACKGROUND OF THE INVENTION

Integrated circuit devices have many applications in industry. In order to provide for their proper operation, they must be tested to insure quality within acceptable limits. Typically, the testing and burn-in of integrated circuit devices require that the integrated circuit be actuated by the engagement of leads or contacts of the integrated circuit with corresponding contacts of a test socket. The contacts of the test socket are electrically connected to a printed circuit board of a test apparatus. These test sockets are generally referred to as "zero insertion force" sockets since they minimize any damage to the contacts associated with the integrated circuit. Many such test sockets currently utilize a lid or cover plate which serves the purpose of positioning and holding the integrated circuit in place while contact is made between the integrated circuit leads and the test socket contacts. This lid also allows for the quick insertion and removal of the integrated circuit.

One drawback of devices currently used for applying pressure to the integrated circuit as it makes contact with the socket is that the pressure applied to the integrated circuit and the individual contacts thereon is not uniform thereby leading to imperfect electrical connections and faulty operation or testing. Furthermore, the insertion by force on the integrated circuit may lead to damage to the integrated circuit itself. The zero insertion force sockets also have a limitation in that the force on each of the contacts and on the integrated circuit is provided by complex arrangements which may utilize springs or other such pressure producing means. As a result, the contacts or leads on the integrated circuit can be damaged or result in faulty operation or testing.

Another limitation of currently available interconnection devices is their lack of generic acceptance to various types of integrated circuits.

It is an object of the present invention to provide an interconnection assembly or apparatus for integrated circuits or integrated circuit packages which provides a controllable, yet uniform pressure across the integrated circuit forcing the contacts thereon to make positive electrical connection with the contacts of a socket or circuit board.

It is another object of this invention to provide an interconnection apparatus or assembly which readily accepts a plurality of different types of integrated circuits therein.

It is still another object of this invention to provide an interconnection assembly or apparatus which is economical to produce and readily manufactured.

It is a further object of this invention to provide an interconnection assembly or apparatus which is capable of providing suitable socket interconnection when the electrical connections of the socket and integrated circuit are located on the top and bottom thereof.

It is an even further object of this invention to provide an interconnection assembly or apparatus which also dissipates any heat associated with the testing operation.

It is still a further object of this invention to provide an interconnection assembly or apparatus which is capable of actively contributing to the burn-in testing of an integrated circuit.

SUMMARY OF THE INVENTION

The foregoing objects are met with the interconnection assembly or apparatus of the present invention for semiconductor/integrated circuit devices. The assembly incorporates therein a bladder-like member which produces a uniform pressure upon an integrated circuit during the testing or operation of the integrated circuit.

A first embodiment of the present invention defines an interconnection assembly which may be either permanently secured to or removably secured to an electric circuit board containing a test and burn-in socket or the like. The apparatus or assembly is made up of a base structure which is adjustably mounted with respect to a socket or circuit board so as to accept various types of integrated circuits therein. A fixturing device or closure element is associated with the base, and interposed between the closure element and an integrated circuit is a flexible component in the form of a bladder-like member which conforms, under pressure, to the back surface of an integrated circuit. Pressure applied to the bladder-like member results in a uniform pressure upon the integrated circuit in order to gently force the integrated circuit contacts or leads into electrical connection with the contacts of a socket or circuit board without any damage thereto.

The bladder-like member is either filled with a compressible or noncompressible fluid and may, under certain circumstances, also contain a heating element therein. The fluid contained within the bladder-like member may act as a heat dissipating means so as to uniformly dissipate the heat generated during the testing of the integrated circuit.

In another embodiment of the present invention a pressure ring is interposed between the bladder-like member and the integrated circuit. The pressure ring is configured so as to accept thereagainst various types of integrated circuits. More specifically, the pressure ring is utilized in conjunction with an integrated circuit having gull wing leads thereby forcing those leads uniformly and without damage into electrical contact with the contacts of a socket or circuit board.

A further embodiment of the present invention provides for an interconnection assembly which incorporates therein an adjusting mechanism which can accurately control the pressure applied by the bladder member upon the integrated circuit. This adjustable feature is extremely important when utilized with very sensitive and easily damaged integrated circuits.

In a still further embodiment of the present invention the interconnection assembly of this invention incorporates therein a closed pressure system to control the flow of fluid into and out of the bladder member. This control of fluid flow provides a uniform pressure upon the integrated circuit.

An even further embodiment of the present invention provides for an interconnection assembly which is capable of use with integrated circuits having contacts on the top and bottom thereof. This interconnection assembly can also be utilized with flexible circuit membranes so as to more efficiently and effectively create contact between the integrated circuit and the socket or circuit board.

BRIEF DESCRIPTION OF THE DRAWINGS

FIG. 1A is a cross sectional view of the interconnection assembly of the present invention for use with semiconductor/integrated circuit devices;

FIG. 1B is a cross sectional view of the interconnection assembly of the present invention for use with semiconductor/integrated circuit devices showing a socket in use therewith;

FIG. 2A is a top view of an embodiment of an adjustable base for use with the interconnection assembly of the present invention;

DETAILED DESCRIPTION OF THE PREFERRED EMBODIMENTS

Figure 2B:
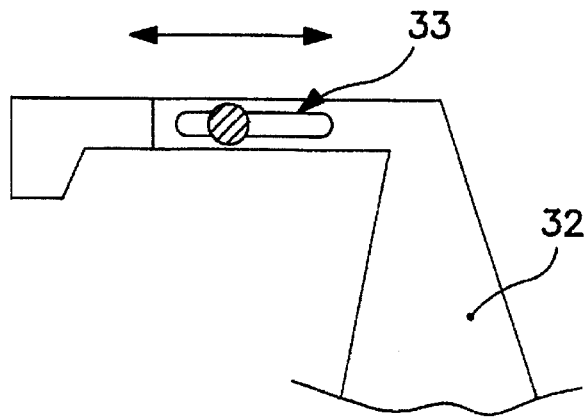
FIG. 2B is a side elevational view of an adjustable locking mechanism used with the interconnection assembly of the present invention.

Reference is now made to FIGS. 1A and B of the drawings which shows a cross-sectional view of the interconnection assembly 10 of the present invention for applying a uniform pressure to an integrated circuit 12 in order to assure an electrical connection between the contacts 14 on the integrated circuit 12 and the contacts 16 on a socket 18 or printed circuit board 20. Integrated circuit 12 will be used generically throughout the specification and claims to denote a semiconductor die, chip or other package or other such packaged semiconductor device or integrated circuit device. Socket 18 can be in the form of a test and burn-in socket or other such socket utilized with integrated circuit 12. Contacts 16 may be electrically connected to the terminals of a printed circuit board 20 of a test apparatus (not shown) or the like.

More specifically, interconnection assembly 10 is made up of a base 22 which is either fixedly secured to or removably secured to circuit board 20. As shown in FIG. 2A of the drawing, base 22 is shown in a rectangular configuration made up of a plurality of segments 24 which are adjustably connected to one another so as to vary the internal configuration of the printed circuit opening 26. Opening 26 may conform to a wide variety of integrated circuits 12 to be tested or otherwise utilized with socket 18. The configuration of base 22 illustrated in FIG. 2A may vary in accordance with the scope of this invention both in the manner in which it can be adjusted and attached to circuit board 20. Furthermore, the shape and configuration of the base may vary accordingly. Additionally, base 22 may be formed of two separate structures, each of which can be adjustably or fixedly secured to the printed circuit board 20 rather than a plurality of interconnected components 24. It is clear from FIG. 2A of the drawings that base 22 may be adjusted both in the longitudinal and horizontal directions to accommodate various sized and configured integrated circuits 12. The interconnection between the segments 24 of base 22 to circuit board 20 is effected by the insertion of removable fastening elements 21 such as screws or the like, through slots 23 into engagement with circuit board 20. This arrangement permits the adjustable, removable relationship between base 22 and circuit board 20.

Referring once again to FIGS. 1A and 1B, rotatably secured to base 22, at one end thereof, is a closure or fixturing element 30. Rotatably mounted at the opposite end of base 22 is a clamping mechanism 32. The exact size and dimensions of the closer element 30 and clamp mechanism 32 may vary within the scope of this invention. It must, however, be designed to conform to the shape of a pressurized bellow-like member 40 to be described hereinbelow.

Referring to FIG. 2B of the drawings, clamp mechanism 32 is illustrated therein as also being adjustable. This adjustability feature of clamp mechanism 32 accommodates any movement or adjustment of base 22. The manner and construction of the adjustment mechanism 33 can also vary within the scope of the present invention.

Still referring to FIGS. 1A and 1B of the drawings, interposed between the integrated circuit 12 and the closer element 30 is a pressuring device in the form of a bladder-like member 40 made of a flexible conductive or non conductive material, such as, for example, rubber or thin metallic foil, respectively. The bladder-like member is filled either with a compressible or noncompressible fluid. The compressible fluid can be in the form of a gas such as nitrogen, air, oxygen or argon and the noncompressible fluid can be in the form of a liquid such as ethylene glycol, water, or even a gelatin substance.

The material which fills the bladder-like member 40 may be a substance which readily dissipates heat. Furthermore, when interconnection assembly 10 is utilized in conjunction with a test and burn-in operation, a heating element 42 can be located inside bladder-like member 40 and be utilized to provide a controlled amount of heat to the integrated circuit. Bladder-like member 40 conforms to the backside of the integrated circuit 12 and applies a controllable pressure thereto.

Bladder like member 40 may be either removably connected within the assembly 10 or it may be secured directly to the undersurface of closure element 30. In addition, an internal chamfer 34 is located about the inner circumference of base 22 to accept and act as a guide for the bladder-like member 40. As clearly shown in FIGS. 1A and 1B of the drawings, as the closure element 30 is brought down upon the bladder-like member 40, pressure is applied to the back surface of integrated circuit 12 so as to gently force the leads or contacts 14 of integrated circuit 12 into electrical contact with the contacts 16 of socket 18 or printed circuit board 20. Clamp mechanism 32 engages an indentation 36 within enclosure element 30 to hold closure element 30 in place upon bladder-like member 40. Adjustability of the pressure applied to bladder-like member 40 is illustrated with respect to other figures of the drawings.

Figure 3:
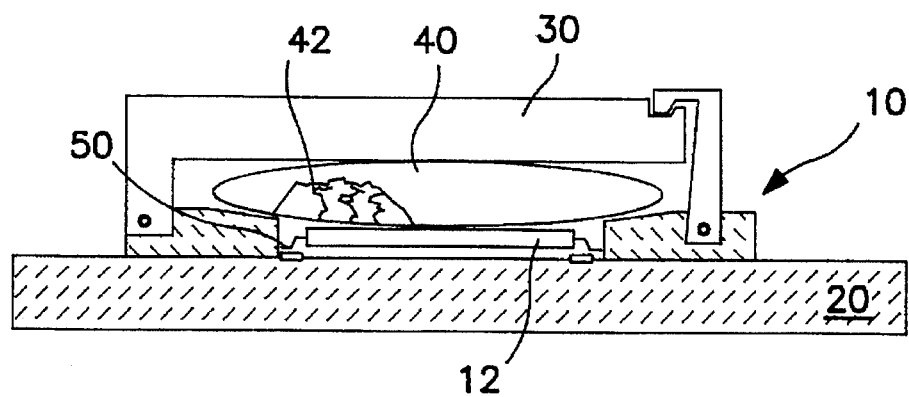
FIG. 3 is a cross sectional view of the interconnection assembly of the present invention shown in FIG. 1 having heating means associated therewith and shown with an integrated circuit having gull wing leads.

FIG. 3 illustrates the interconnection assembly 10 of the present invention utilized in conjunction with an integrated circuit 12 containing thereon gull wing contacts or leads 50. Furthermore, FIG. 3 clearly illustrates heating elements 42 located within bladder-like member 40 in order to provide a controlled amount of heat to the integrated circuit 12. This heat source can be used with a burn-in test socket 18.

Figure 4:
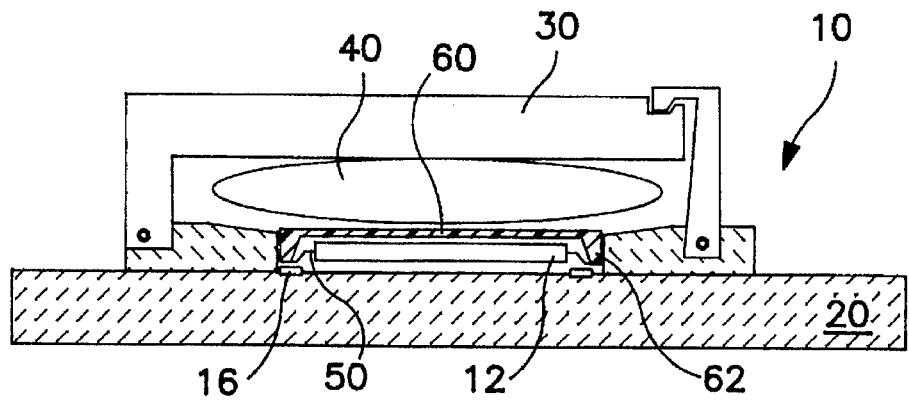
FIG. 4 is a cross sectional view of the interconnection assembly of the present invention incorporating a pressure ring therein.

In order to assure contact between the gull wing leads 50 and the contacts 16 of socket 18, FIG. 4 illustrates a pressure ring 60, made of elastomer material, interposed between the bottom surface of bladder-like member 40 and integrated circuit 12. Pressure ring 60 has outstanding elements 62 thereon which conform to and align with the gull wing leads 50 so as to apply uniform but sensitive pressure to leads 50. This assures contact between leads 50 and contacts 16.

Figure 5:
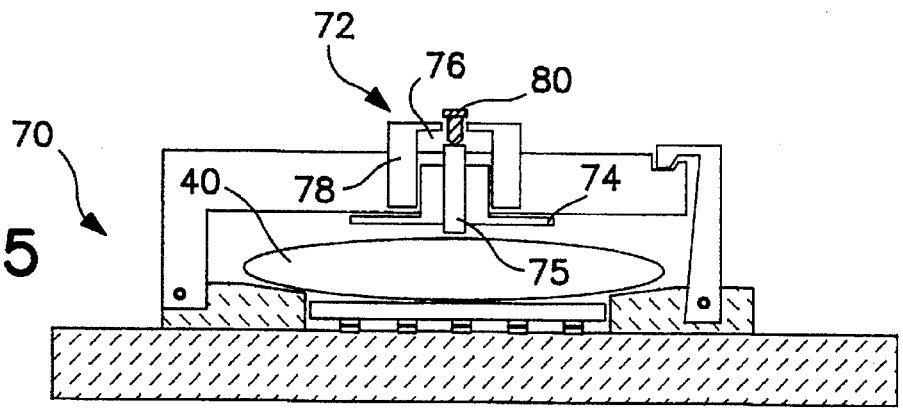
FIG. 5 is a cross sectional view of the interconnection assembly of this invention utilizing an adjustable feature for varying the pressure on the bladder-like member.

FIG. 5 of the drawings illustrates a cross sectional view of a further embodiment of the interconnection assembly 70 of this invention in which components identical to those described with respect to FIGS. 1A, 1B, 2A, 2B, 3 and 4 of the drawings will be given identical reference numerals. An adjusting mechanism 72 is incorporated within the closure element 30 so as to apply a uniform, yet adjustable amount of pressure on the bladder-like member 40. The adjusting mechanism 72 illustrated in FIG. 5 of the drawings can be made of a number of different configurations, all within the scope of this invention. The embodiment of this invention illustrated in FIG. 5 shows a pressure plate 74 having its support 75 located within a central aperture 76 in housing 78. A screw-like device 80 is threadably inserted within housing 78 and applies a controllable amount of force on plate 74. This pressure is transferred to bladder-like member 40.

Figure 6:
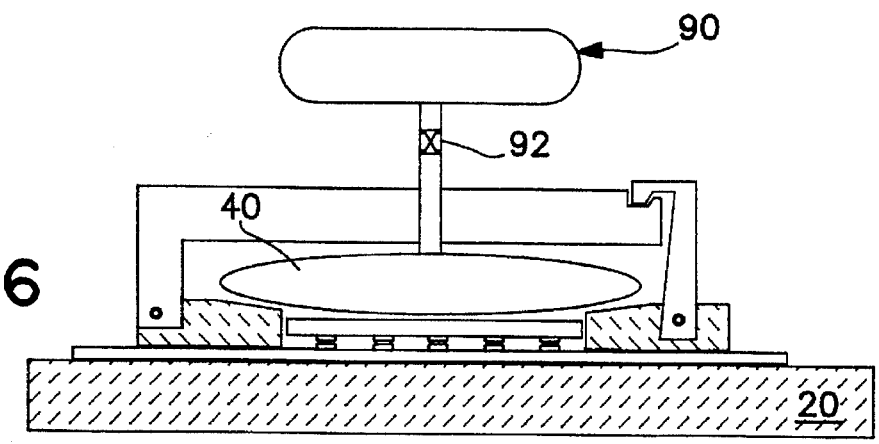
FIG. 6 is a cross sectional view of the interconnection assembly of this invention illustrating a closed pressure system for regulating the pressure applied to the bladder-like element.

FIG. 6 of the drawing illustrates another embodiment of this invention for controlling the pressure upon bladder-like member 40. This embodiment of the invention includes a source of fluid in a closed system 90 which can be applied to the interior of bladder-like member 40 or removed therefrom by any suitable adjustable valve system 92. The utilization of a closed system permits accurate controllability of the pressure which is applied from bladder-like member 40 to integrated circuit 12.

Figure 7:
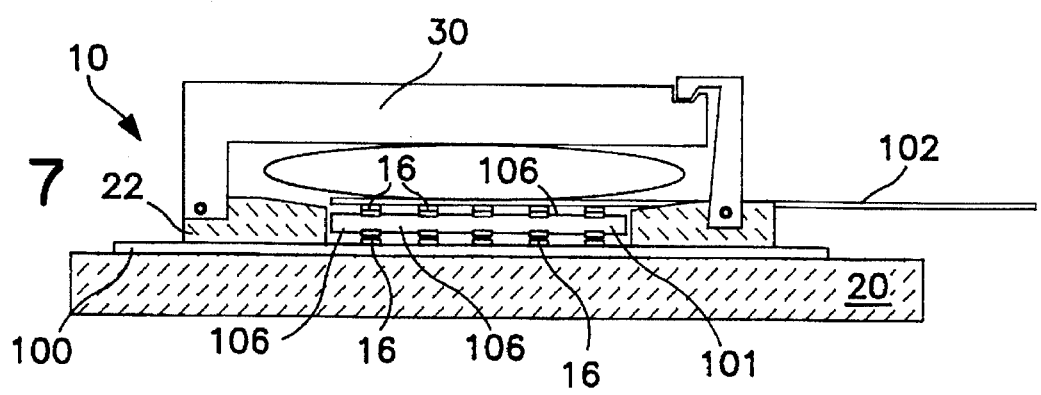
FIG. 7 is a cross sectional view of the interconnection assembly of this invention used in conjunction with an integrated circuit having upper and lower contacts thereon and connected to the contacts on a flexible circuit membrane.

FIG. 7 of the drawings illustrates interconnection assembly 10 utilized in conjunction with a pair of flexible circuit membranes 100 and 102. One of the membranes 100 is interposed beneath the base 22 and the other membrane 102 is positioned above base 22. Each of the flexible circuit membranes have contacts 16 thereon for electrical connection with an integrated circuit 101 also having contacts 106 both on the upper and lower surface thereof. Utilization of the flexible circuit membranes 100 and 102 permit the movement of contacts 16 for adjustable engagement with the contacts 106 of integrated circuit 101.

Although the invention has been described with reference to particular embodiments, it will be understood that this invention is also capable of further and other embodiments within the spirit and scope of the appended claims.

What is claimed is:

1. An interconnection apparatus for making electrical connection to contacts on an integrated circuit device comprising:

a circuit board;

a bladder-like member, said bladder-like member having fluid therein;

means for aligning the integrated circuit device with said circuit board and for positioning said bladder-like member in a preselected relationship with respect to the integrated circuit device;

said aligning and positioning means including a base having an edge thereon for supporting the periphery of said bladder-like member in such a position to enable the majority of the undersurface of said bladder-like member to bear against the integrated circuit device;

means for forcing said bladder-like member into contact with the integrated circuit device thereby causing the contacts on the integrated circuit device to make electrical connection with said circuit board.

2. An interconnection apparatus as defined in claim 1 wherein said edge of said base is chamfered.

3. An interconnection apparatus as defined in claim 1 further comprising:

means for adjustably controlling the force applied to said bladder-like member.

4. An interconnection apparatus as defined in claim 1 wherein said means for aligning the contacts on the integrated circuit device with said circuit board comprises:

adjustable means associated with said base for controlling the internal configuration of said base so as to accept the integrated circuit device therein.

5. An interconnection apparatus as defined in claim 1 wherein said fluid is a compressible gas.

6. An interconnection apparatus as defined in claim 1 wherein said fluid is a noncompressible liquid.

7. An interconnection apparatus as defined in claim 1 wherein said fluid is a heat conductor.

8. An interconnection apparatus as defined in claim 1 further comprising:

a flexible membrane interposed between said base and circuit board, said flexible membrane having locations thereon for electrically connecting with the contacts on the integrated circuit device.

9. An interconnection apparatus as defined in claim 8 further comprising another flexible membrane having locations thereon for electrically connecting with other contacts on the integrated circuit device.

10. An interconnection apparatus as defined in claim 1 further comprising a socket interposed between the integrated circuit device and said circuit board.

11. An interconnection apparatus for making electrical connection to contacts on an integrated circuit device comprising:

a circuit board;

means for aligning the contacts on the integrated circuit device with said circuit board;

a bladder-like member, said bladder-like member having fluid therein;

means for forcing said bladder-like member into contact with the integrated circuit device thereby causing the contacts to make electrical connection with said circuit board; and, a pressure ring, said pressure ring being interposed between the undersurface of said bladder-like member and the integrated circuit device, said pressure ring having means thereon for exerting a force directly on gull wing leads of the integrated circuit device having gull wing leads, forcing the gull wing leads into electrical connection with said circuit board.

12. An interconnection apparatus for making electrical connection to contacts on an integrated circuit device comprising:

a circuit board;

means for aligning the contacts on the integrated circuit device with said circuit board;

a bladder-like member, said bladder-like member having fluid therein;

means for forcing said bladder-like member into contact with the integrated circuit device thereby causing the contacts to make electrical connection with said circuit board; and, said bladder-like member has a heating element located therein.

13. An interconnection assembly for use with a circuit board in order to electrically connect contacts of an integrated circuit device with the circuit board, said interconnection assembly comprising:

- a base, wherein said base is adjustably mounted with respect to the circuit board in order to accommodate various sized integrated circuit devices, said base having means thereon for removably attaching said base to the circuit board and having a preselected configuration for accepting the integrated circuit device therein such that the contacts thereon are aligned with the circuit board;
- a bladder-like member, said bladder-like member having fluid therein;
- means operably connected to said base for forcing said bladder-like member into contact with the integrated circuit device thereby causing the contacts thereon to make electrical connections with the circuit board.

14. An interconnection assembly as defined in claim 13 wherein said base has an edge thereon for supporting the periphery of said bladder-like member in such a position to enable the majority of the undersurface of said bladder-like member to bear against said integrated circuit device.

15. An interconnection assembly as defined in claim 14 further comprising means operably connected to said base for adjustably controlling the force applied to said bladder-like member.

16. An interconnection assembly as defined in claim 15 further comprising:

- a pressure ring, said pressure ring being interposed between the undersurface of said bladder-like member and the integrated circuit device, said pressure ring having means thereon for exerting a force directly on gull wing leads of the integrated circuit device having gull wing leads, forcing the gull wing leads into electrical connection with the circuit board.

17. An interconnection assembly as defined in claim 14 wherein said edge of said base is chamfered.

18. An interconnection assembly as defined in claim 13 wherein said bladder-like member has a heating element located therein.

* * * * *